(12) United States Patent
Chinthakindi et al.

(10) Patent No.: US 7,271,700 B2
(45) Date of Patent: Sep. 18, 2007

(54) THIN FILM RESISTOR WITH CURRENT DENSITY ENHANCING LAYER (CDEL)

(75) Inventors: Anil K. Chinthakindi, Wappingers Falls, NY (US); Ebenezer E. Eshun, Highland, NY (US)

(73) Assignee: International Business Machines Corporation, Armonk, NY (US)

( * ) Notice: Subject to any disclaimer, the term of this patent is extended or adjusted under 35 U.S.C. 154(b) by 214 days.

(21) Appl. No.: 10/906,365

(22) Filed: Feb. 16, 2005

(65) Prior Publication Data

US 2006/0181388 A1     Aug. 17, 2006

(51) Int. Cl.
*H01C 1/012*     (2006.01)

(52) U.S. Cl. .................. 338/309; 338/20; 361/207; 438/270; 257/767

(58) Field of Classification Search ............... 338/20, 338/22 R, 22 SD, 307–314; 200/181; 361/207; 505/430; 438/270, 424, 445; 257/767, 512
See application file for complete search history.

(56) References Cited

U.S. PATENT DOCUMENTS

| | | | |
|---|---|---|---|
| 4,166,279 A * | 8/1979 | Gangulee et al. ........... 257/767 |
| 4,232,059 A | 11/1980 | Proffitt | |
| 5,356,869 A * | 10/1994 | Capone et al. .............. 505/430 |
| 5,783,483 A | 7/1998 | Gardner | |
| 6,054,659 A * | 4/2000 | Lee et al. ................... 200/181 |
| 6,386,685 B1 | 5/2002 | Sugioka | |
| 6,432,822 B1 | 8/2002 | Ngo et al. | |
| 6,534,374 B2 | 3/2003 | Johnson et al. | |
| 6,599,827 B1 | 7/2003 | Ngo et al. | |
| 6,787,444 B2 | 9/2004 | Gardner | |
| 6,806,191 B2 | 10/2004 | Zistl et al. | |
| 6,809,021 B2 | 10/2004 | Ohtani et al. | |
| 6,933,186 B2 | 8/2005 | Cotte et al. | |
| 6,958,276 B2 * | 10/2005 | Lin et al. ..................... 438/270 |
| 2003/0222340 A1 | 12/2003 | Kondo et al. | |
| 2004/0152299 A1 | 8/2004 | Mahalingam et al. | |
| 2004/0203192 A1 | 10/2004 | Gracias | |

FOREIGN PATENT DOCUMENTS

| | | |
|---|---|---|
| JP | 03-132022 | 6/1991 |
| JP | 09-129638 | 5/1997 |
| JP | 2003-243520 | 8/2003 |

* cited by examiner

*Primary Examiner*—Richard K. Lee
(74) *Attorney, Agent, or Firm*—Scully, Scott, Murphy & Presser, P.C.; Lisa U. Jaklitsch

(57) ABSTRACT

A thin film resistor device and method of manufacture includes a layer of a thin film conductor material and a current density enhancing layer (CDEL). The CDEL is an insulator material adapted to adhere to the thin film conductor material and enables the said thin film resistor to carry higher current densities with reduced shift in resistance. In one embodiment, the thin film resistor device includes a single CDEL layer formed on one side (atop or underneath) the thin film conductor material. In a second embodiment, two CDEL layers are formed on both sides (atop and underneath) of the thin film conductor material. The resistor device may be manufactured as part of both BEOL and FEOL processes.

28 Claims, 11 Drawing Sheets

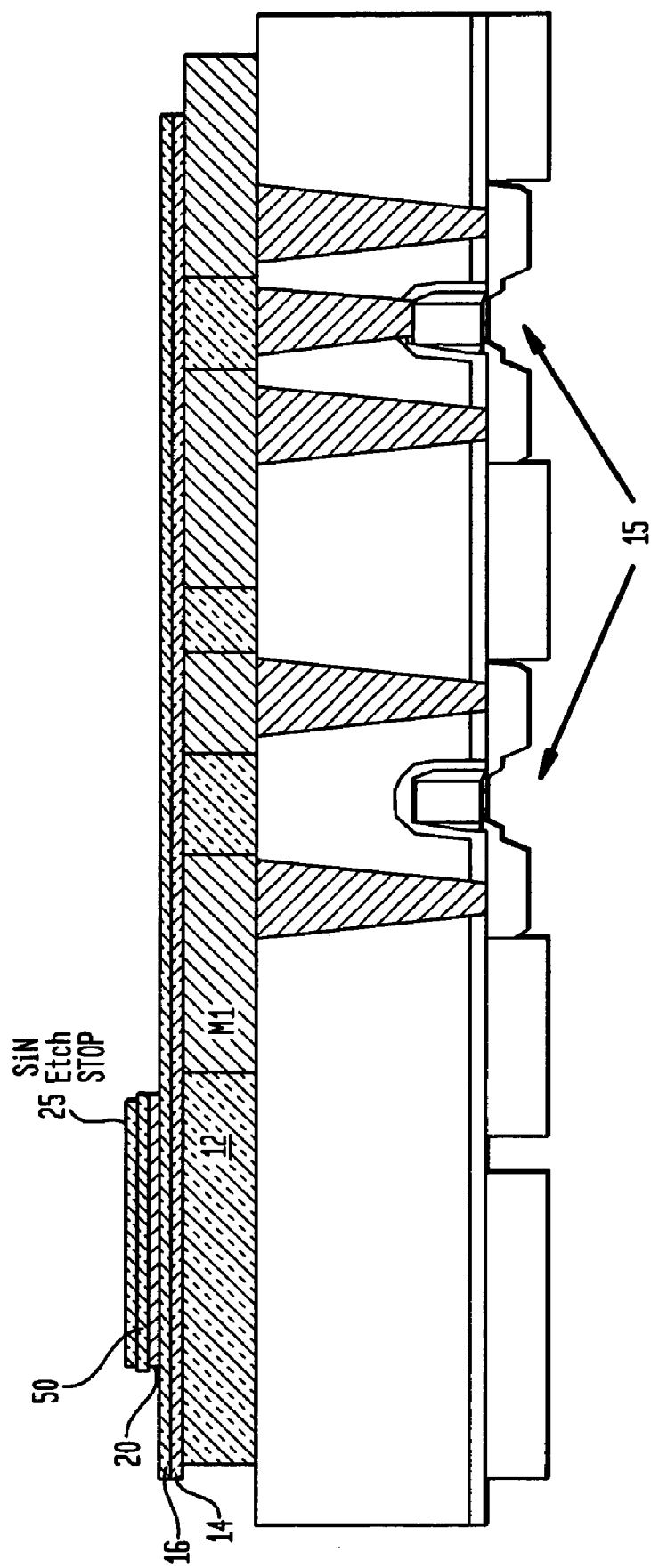

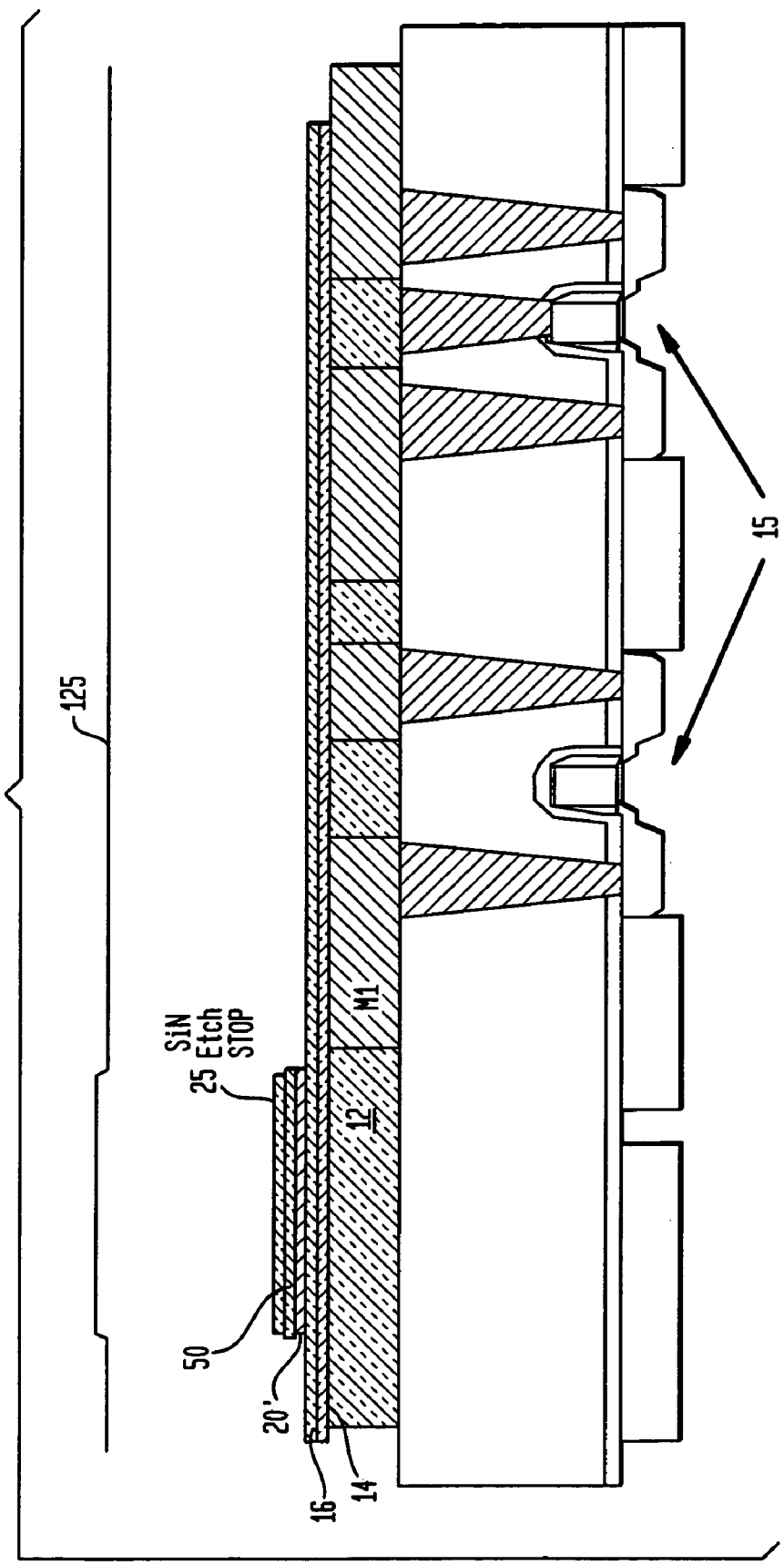

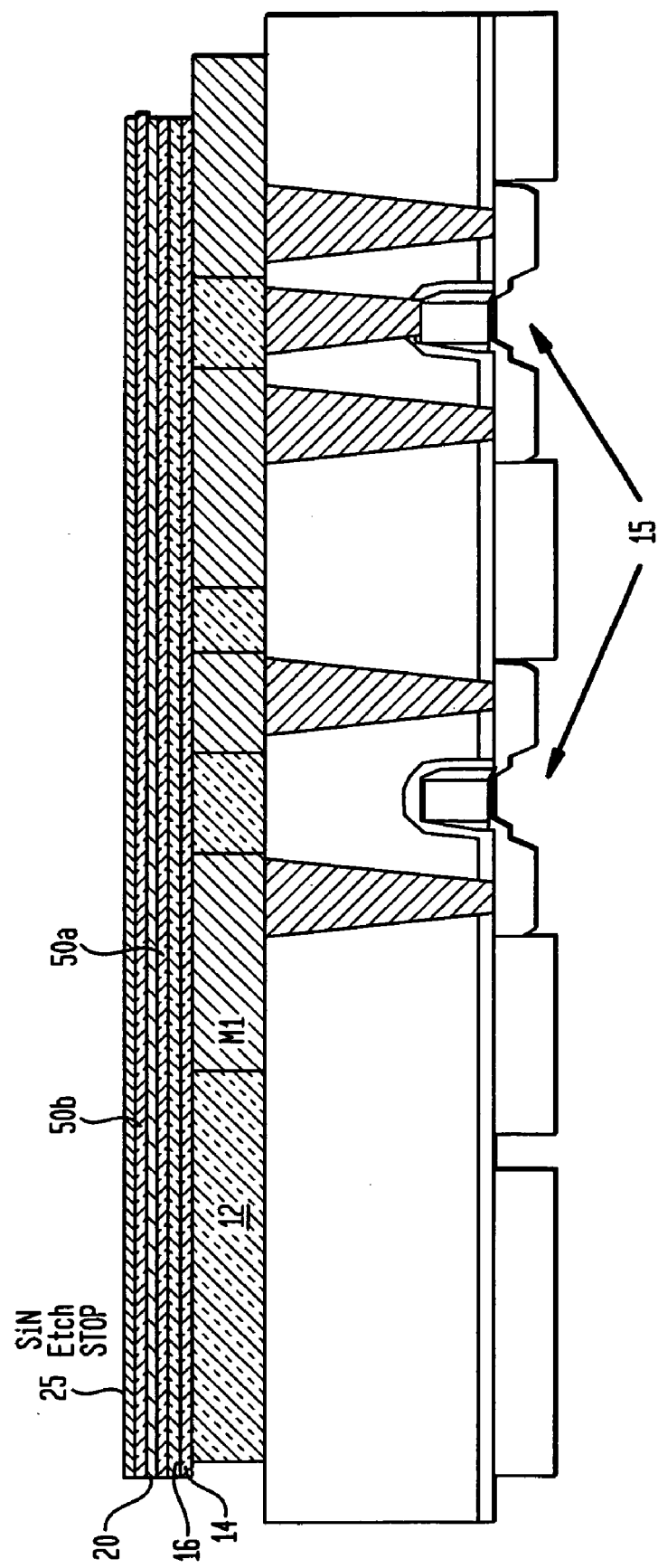

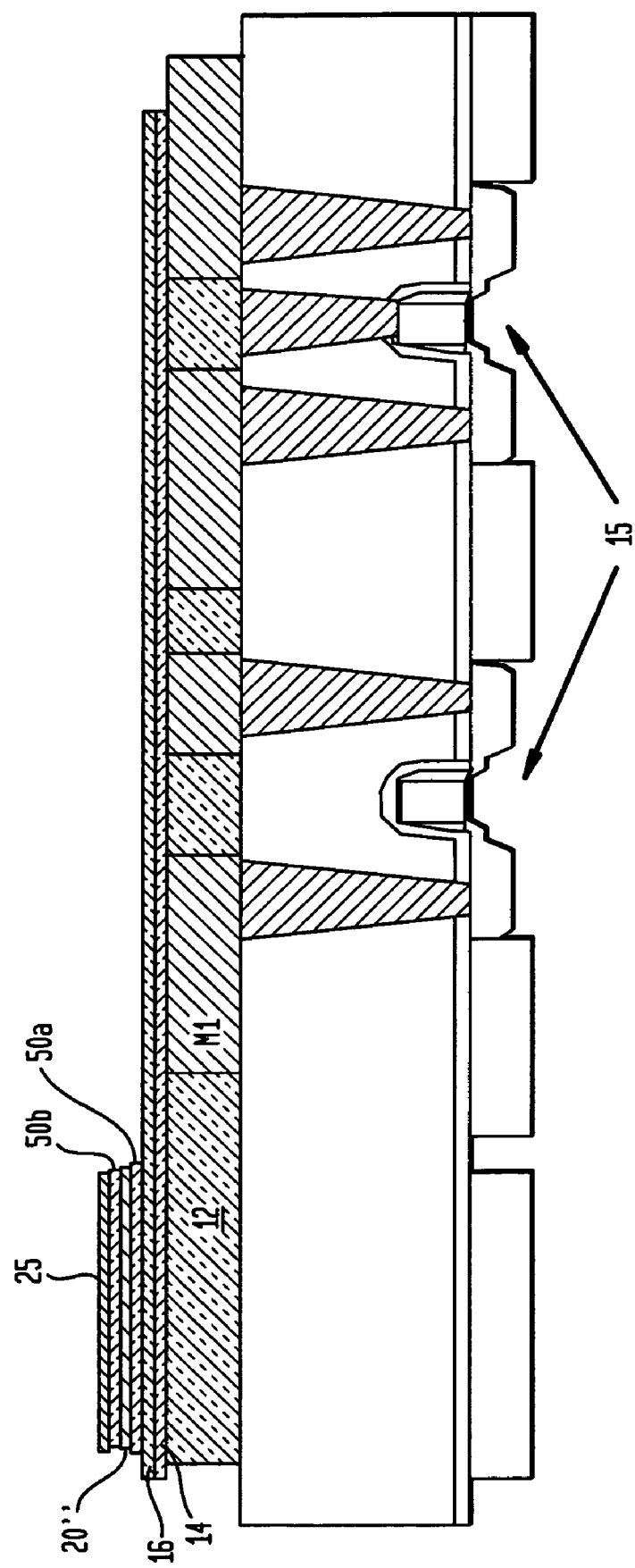

THIN FILM RESISTOR WITH CURRENT DENSITY ENHANCING LAYER (CDEL)

BACKGROUND

1. Field of the Invention

The present invention relates generally to the field of semiconductor thin film resistors, and more particularly, to a novel integrated circuit thin film resistor having a current density enhancing layer.

2. Description of the Prior Art

In semiconductor integrated circuits (ICs), a resistor may be used to control the resistance of other electronic components of the IC. As is known to those skilled in the art, the resistance, R, of a resistor is proportional to the length, L, of the resistor and the reciprocal cross sectional area, 1/A, of the resistor; the L and A are measured in the direction of current flow. The basic equation for resistance of a resistor is thus: R=L/A, where R, L and A are as defined above.

Prior art resistors are typically composed of polysilicon that has been doped. As the integration of semiconductor devices increases, each component within a semiconductor IC has to provide equivalent or better electrical properties. A downscaled resistor thus has to provide a constant resistance value that does not fluctuate much during use. However, due to the properties of polysilicon, a prior art resistor comprised of doped polysilicon can only provide a limited resistance within a limited space. Employing a polysilicon resistor to provide relatively high resistance then becomes a problem in designing and fabricating a highly integrated semiconductor device.

Recently, doped polysilicon resistors have been replaced with a single thin film resistor that is comprised of a material that has a higher resistivity than that of polysilicon. Examples of such higher resistivity materials include, but are not limited to: TiN and TaN. Tantalum nitride, TaN, containing 36% $N_2$ is a material currently being used in the back-end-of-the line (BEOL) of most semiconductor devices.

BEOL resistors of high current carrying capability are highly desired by integrated circuit designers. Current TaN resistors (e.g., K1 resistor) offer only 0.5 mA/μm current/width and ever lower current density for 9SF and 10SF generations.

FIG. 1 depicts a BEOL resistor structure 10 according to the prior art. As shown, the BEOL resistor structure is formed atop of a first metallization level M1 comprising a metal such as aluminum or copper, that is electrically coupled by via structures V1, to FEOL device structures 15, e.g., CMOS FET or BJT or like transistor devices formed utilizing conventional techniques that are well known to those skilled in the art. The first metallization level M1 includes an interlevel dielectric material layer 12 in which the M1 metal layer structures are formed. As shown in the structure 10 of FIG. 1, formed atop the interlevel dielectric material layer 12 and M1 metallization is a first thin-film cap dielectric layer 14 of a material such as SiN and a thin dielectric layer 16 deposited thereon comprising an oxide, such as $SiO_2$, or any other like oxide. The thin-film TaN resistor structure 20 of between 300 Å to 700 Å is shown formed on top of the dielectric layer 16, and a thin film capping layer, i.e., etch stop layer 25 of SiN or SiCN (nBLOK), for example, is formed over the resistor structure. Then, typical fabrication processes as known in the art are used to form a further interlevel dielectric material layer and a via structure V1 that connects the first metallization to a second metallization level M2.

For copper interconnects, better passivation and capping of the top surface of the metal has been proven to increase the electro migration performance of the copper. CoWP and reverse liner barrier films have be demonstrated to increase the performance of the interconnects. It is suspected, however, that for the TaN resistor, capping materials such as SiN or SiCN are not providing sufficient protection (and capping) for higher current performance.

Moreover, the currently provided etch stop layer, e.g., nBLOK (SiCN) or SiN, does not adhere well to the TaN film, and thus not as effective to prevent shifting of resistance during stress/aging.

U.S. Published Patent Application No. US 2004/0152299 describes a method of forming a thin film resistor. In this disclosure, a conductive layer 120 of TiN or TiW formed after the via hole (as in a linear) and a layer that comprises a typical etch stop layer (e.g., SiN). This "stack" actually is comprised of "Resistor film/SiN/Via.

U.S. Published Patent Application No. US 2004/0203192 describes methods for forming Cu lines with organic monolayers bonded to the surface for increased electro migration resistance.

It would be highly desirable to provide a novel thin film resistor structure and method of fabricating the resistor by providing a barrier material over the thin-film resistor structure to thereby enhance the current-carrying capability of the resistor.

It would be highly desirable to provide a novel thin film resistor structure and method of fabricating the resistor by providing a barrier material layer over a TaN film resistor structure that exhibits increased resistance to stress/aging.

SUMMARY OF THE INVENTION

It is an object of the present invention to provide a novel thin film resistor structure and method of fabricating the resistor.

It is a further object to provide a novel thin film resistor structure and method of fabricating the resistor by providing a barrier material over the thin-film resistor structure to thereby enhance the current-carrying capability of the resistor.

It is another object of the present invention to provide a novel thin film resistor structure of TaN material having an added barrier material layer with better adhesion to TaN to enhance the current carrying capability of the resistor.

According to the invention, this added barrier material is called the Current Density Enhancement Layer (CDEL) and provides increased resistance to shifting during stress/aging. The CDEL is thin; for example, less than 100 Å in thickness, and does not interfere with via etching process steps during BEOL or FEOL resistor fabrication.

The CDEL barrier film, in addition to SiN or SiCN cap materials over the TaN film, increases the current carrying capability of the resistor. In one aspect of the invention, the barrier films are formed by depositing a thin layer of Alumina, $Al_2O_3$, or deposition of a thin layer of Aluminum and air oxidizing or by oxidation using a low power plasma for a short duration. Other films with good adhesion to the resistor film may also be used.

Thus, in accordance with the present invention, there is provided a thin film resistor device and method of manufacture where the device includes a layer of a thin film conductor material and a current density enhancing layer (CDEL). The CDEL is an insulator material adapted to adhere to the thin film conductor material and enables the said thin film resistor to carry higher current densities with reduced shift in resistance with an applied stress, e.g., temperature. In one embodiment, the thin film resistor device includes a single CDEL layer formed on one side (atop or underneath) the thin film conductor material. In a second embodiment, two CDEL layers are formed on both sides (atop and underneath) of the thin film conductor material.

Advantageously, the structure and method of the invention is applicable to manufacturing in both BEOL and FEOL processes.

BRIEF DESCRIPTION OF THE DRAWINGS

FIGS. 2(a)-2(f) are pictorial representations (through cross sectional views) illustrating the process for forming a thin-film resistor having CDEL structure according to a first embodiment of the present invention; and, FIGS. 3(a)-3(d) are pictorial representations (through cross sectional views) illustrating the process for forming a thin-film resistor having CDEL structure according to a second embodiment of the present invention.

DETAILED DESCRIPTION

Figure 1:
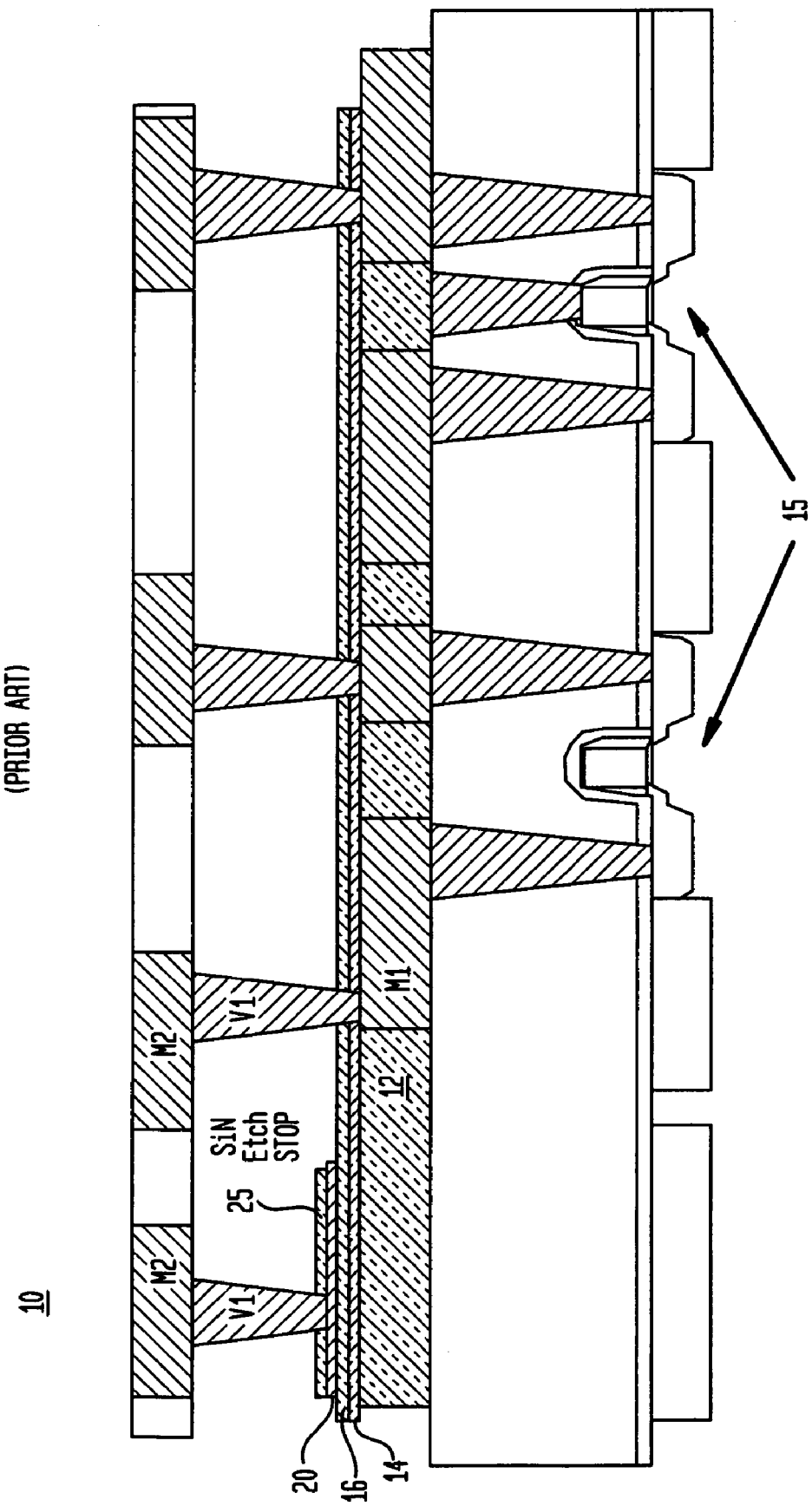
FIG. 1 is a pictorial representation (through a cross sectional view) illustrating a basic BEOL thin-film TaN resistor structure and the processing employed in its manufacture according to the prior art.

The present invention, which provides processes for fabricating a precision thin-film resistor that exhibits enhanced current carrying capability, will now be described in greater detail by referring to the various drawings that accompany the present application. The drawings are provided herein for illustrative purposes and thus they are not drawn to scale.

Moreover, the drawings of the present invention show a fragment of a semiconductor wafer or chip in which only one resistor device region is shown in a Back-End-Of-Line (BEOL) manufacturing process. Although the drawings show the presence of only a single resistor device region, the present processes can be used in forming a plurality of resistors across different resistor device regions on the surface of a single semiconductor chip or wafer. Moreover, the invention is applicable to front-end-of-line (FEOL) processes whereby the inventive resistor device structure is formed on a Si-containing substrate, for instance having other device regions including bipolar transistors and/or CMOS devices, such as FETs, that are formed to the periphery of the resistor device region shown in the drawings of the present application.

Figure 2A:
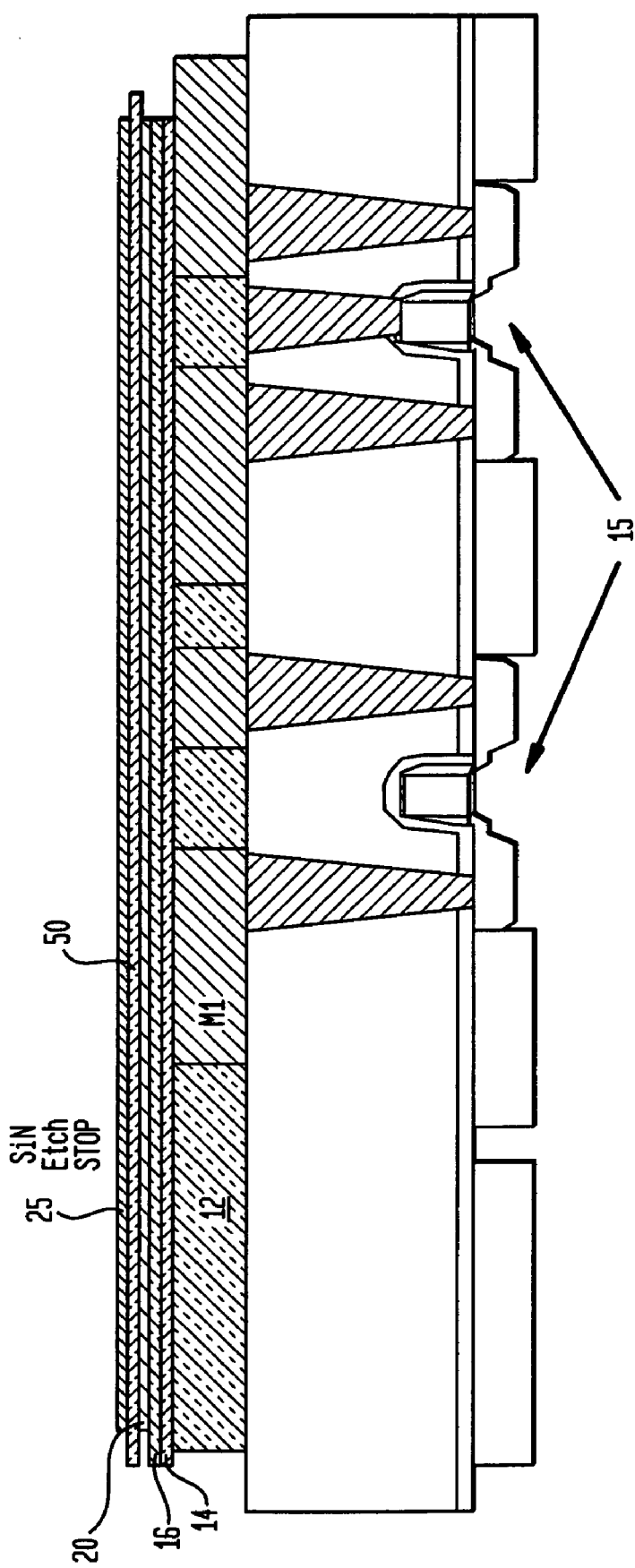

Referring to FIG. 2(a), a first step involves depositing the interlevel dielectric layer 12, which may comprise a dielectric material such as a low-k organic or inorganic interlevel dielectric (ILD) of low-k dielectric material which may be deposited by any of number of well known techniques such as sputtering, spin-on, or PECVD and may include a conventional spun-on organic dielectrics, spun-on inorganic dielectrics or combinations thereof which have a dielectric constant of about 3.5 or less. Suitable organic dielectrics that can be employed include dielectrics that comprise C, O and H. Examples of some types of organic dielectrics that can be employed in the present invention include, but are not limited to: aromatic thermosetting polymeric resins, and other like organic dielectrics. The organic dielectric employed as interlevel dielectric layers may or may not be porous, with porous organic dielectric layers being highly preferred due to the reduced k value. Suitable inorganic dielectrics that may be employed as the interlevel dielectric typically comprise Si, O and H, and optionally C, e.g., $SiO_2$, SiCOH, carbon-doped oxides (CDO), silicon-oxicarbides, organosilicate glasses (OSG) deposited by plasma enhanced chemical vapor deposition (CVD) techniques. Illustrative examples of some types of inorganic dielectrics that can be employed include, but are not limited to: the silsesquioxane HOSP, methylsilsesquioxane (MSQ), hydrido silsesquioxane (HSQ), MSQ-HSQ copolymers, tetraethylorthosilicate (TEOS), organosilanes and any other Si-containing material. For purposes of discussion it is assumed that the interlevel dielectric material layer 12 is $SiO_2$.

Utilizing conventional photolithographic processing techniques, the first metal layer M1 is formed at designed locations that connect with FEOL devices utilizing processes well known in the art. For purposes of description, the M1 metal layer may comprise copper or aluminum.

Formed above the interlevel dielectric material layer and M1 metallization is a protective dielectric layer 14 typically comprised of an inorganic dielectric that differs from a second dielectric layer 16 deposited on top of layer 14. In particular, the protective dielectric layer 14 is comprised of an oxide, nitride, oxynitride or any combination thereof, including multilayers. The protective dielectric layer 14 is typically a nitride such as SiN and the second dielectric layer 16 formed thereon is typically $SiO_2$ but could be other dielectrics such as SiCOH. The thickness of the protective dielectric layer 14 may vary depending on the type of material and deposition process employed in forming the same. Typically, the protective dielectric material has a thickness from about 10 Å to about 1000 Å.

After sequentially depositing layers 14 and 16, a layer 20 of material forming the thin-film resistor is deposited atop the second dielectric layer 16. This layer 20 is typically TaN, however may include other conductive metal materials including, but not limited to: Ta, TaN, Ti, TiN, W, WN, NiCr, SiCr, and the like, for forming the thin film resistor. Combinations of these materials are also contemplated herein. Preferably, the conductive metal 20 comprises TaN, TiN, NiCr or SiCr, with TaN and TiN being particularly preferred. The conductive metal 20 is a thin layer whose thickness is typically from about 300 Å to about 700 Å with a thickness from about 450 Å to about 550 Å being more typical. The conductive metal forming the thin-film resistor can be formed on the etch stop layer 14 utilizing any deposition process including, for example, CVD, PECVD, sputtering, plating, evaporation, ALD and other like deposition processes.

After forming the conductive metal 20, a thin Current Density Enhancing Layer (CDEL) 50 is patterned and formed on the conductive metal 20 providing the structure shown, for example, in FIG. 2(a). The CDEL layer 50 comprises a dielectric material such as $Al_2O_3$ layer deposited to a thickness of less than 100 Å by atomic layer deposition (ALD), for example, utilizing a precursor such as Trimethylaluminum $Al(CH_3)_3$ and an oxidant such as Ozone ($O_3$) at a deposition temperature of 380° C., in one embodiment Preferably, the thickness of the CDEL layer is less than 50 Å. The CDEL layer 50 is preferably of a material that adheres well to the underlying thin film resistor material TaN and increases the current carrying capability of the resistor device as will be described in greater detail herein below. More importantly, as will be described in greater detail herein, the provision of a CDEL layer 50 reduces the shift in resistance when a temperature stress is applied, for example. Thus, besides deposition of the $Al_2O_3$ CDEL layer 50, alternatively, the CDEL layer 50 may comprise a thin layer of Aluminum, deposited to a thickness ranging between 10

Å and 20 Å and oxidizing the thin Al layer by an $O_2$ plasma or air oxidation. In other example embodiments, the CDEL layer 50 may comprise metal oxides such as $Ta_2O_5$, $HfO_2$, $ZrO_2$, and the like, with the thickness ranging from 10 Å to 50 Å.

After providing the structure 100 shown in FIG. 2(a), an etch stop layer 25 is deposited over the CDEL layer 50 structure. The etch stop layer 25 is formed utilizing any conformal deposition process including, for example, chemical vapor deposition (CVD), plasma enhanced chemical vapor deposition (PECVD), chemical solution deposition, evaporation, atomic layer deposition (ALD) and other like deposition processes. The thickness of the etch stop layer 25 formed may vary depending on the deposition process used as well as the type of insulating material employed. Typically, and for illustrative purposes, the etch stop layer 25 has a thickness from about 20 to about 50 nm, with a thickness from about 30 to about 40 nm being more typical. Etch stop layer 30 may comprise any insulating material that can serve as a layer in which an etching process can be stopped on. Illustratively, the etch stop layer 25 may comprise an oxide, nitride, oxynitride or any combination thereof. In a preferred embodiment, the etch stop layer 25 is comprised of SiN, SiCN (nBLOK) or Si oxynitride.

Figure 2B:
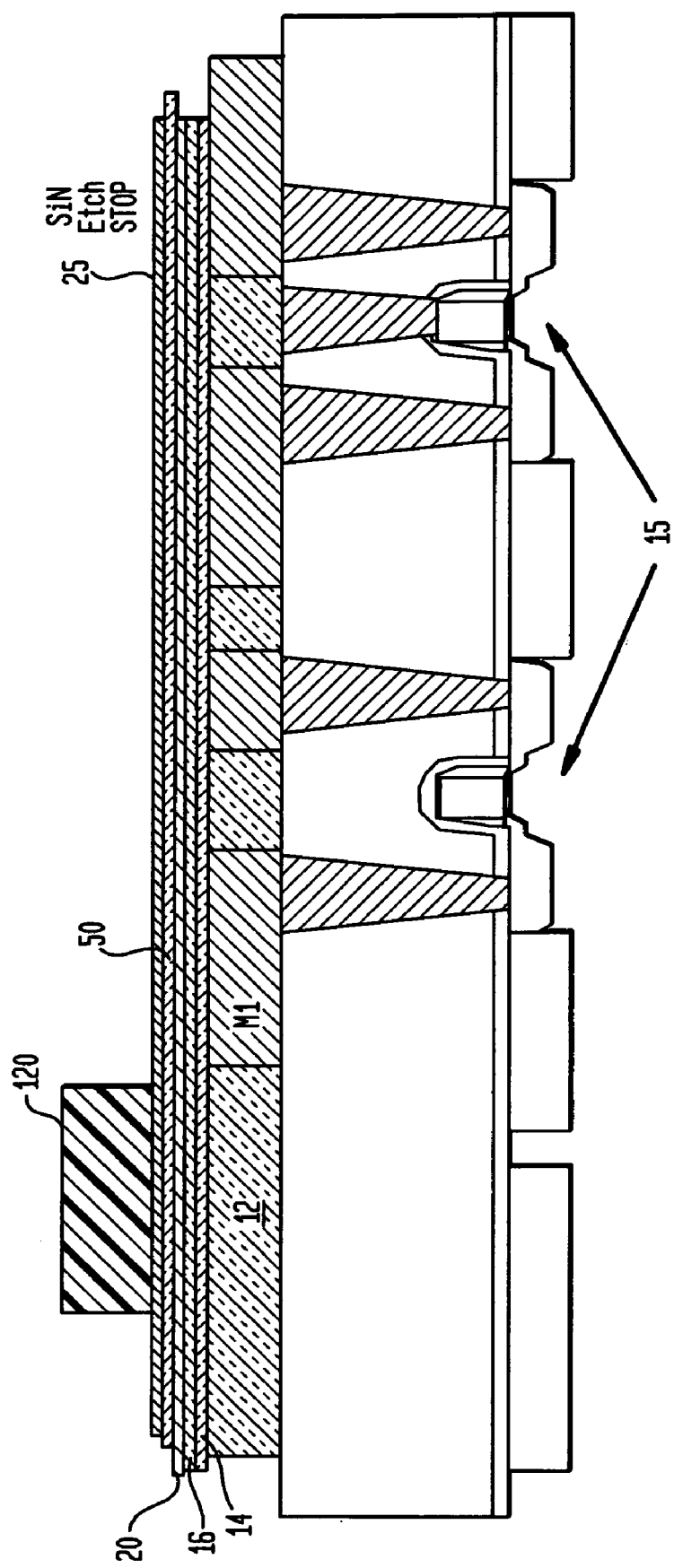
Figure 2E:
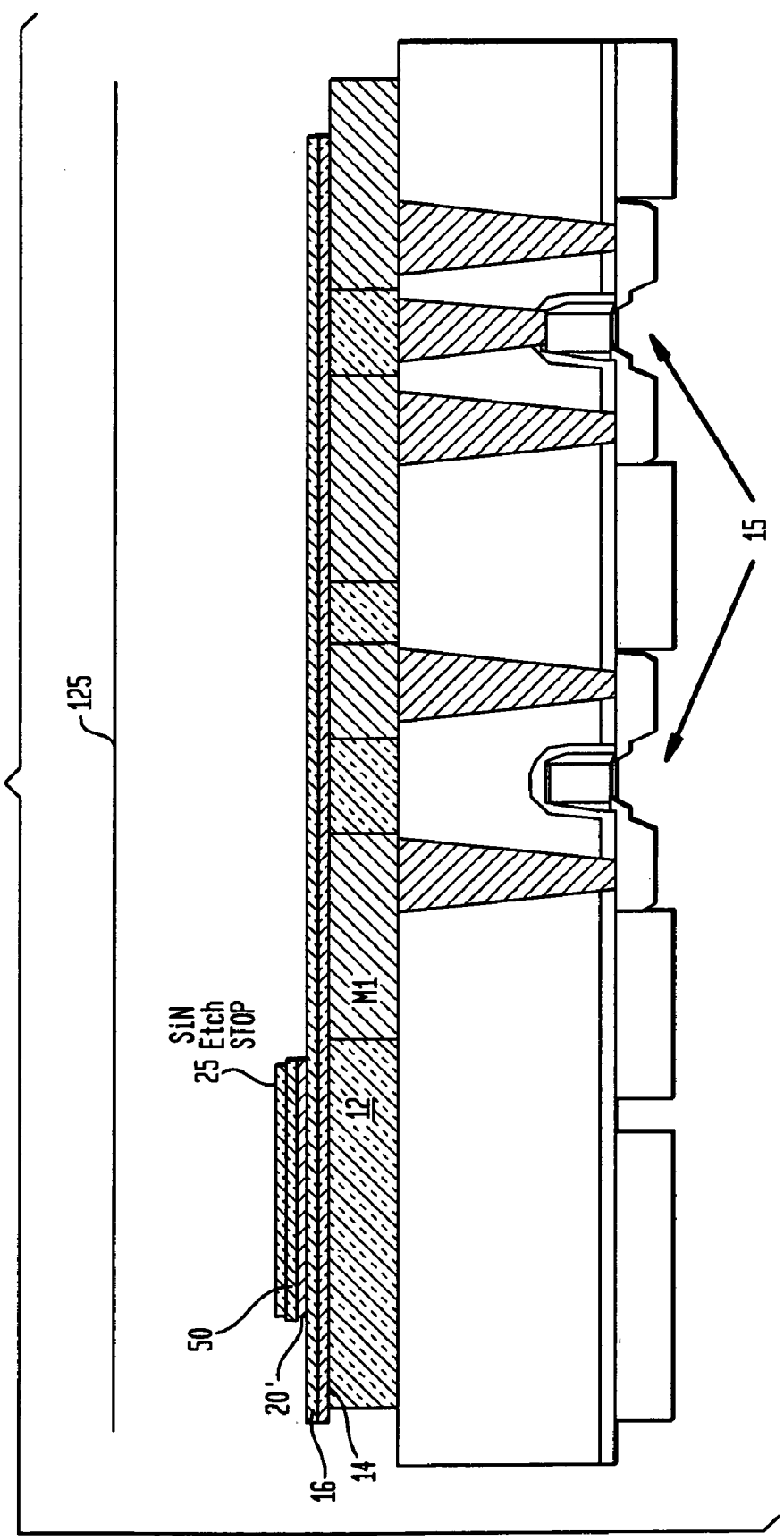

In a next processing step, as shown in FIG. 2(b), the thin-film resistor features are patterned by applying a lithographic mask (photoresist layer) 120, for example. Then, as shown in FIG. 2(c), an etching step is performed to form the resistor device 20'. This is accomplished by removing the layers 25, 50 and 20 outside of the mask perimeter and stopping on layer 16. Continuing, the formed resist layer 120 is removed in a next process step. Continuing as shown in FIG. 2(d), a further interlevel dielectric layer, formed of materials described herein, is deposited on top of the exposed layer 16 and over the resistor structure 20' and is planarized to form the structure shown in FIG. 2(e). Finally, as shown in FIG. 2(f), via structures V1 may be formed using conventional techniques to electrically couple the resistor device 20' of the invention to a further metallization layer, e.g., M2.

Figure 3B:
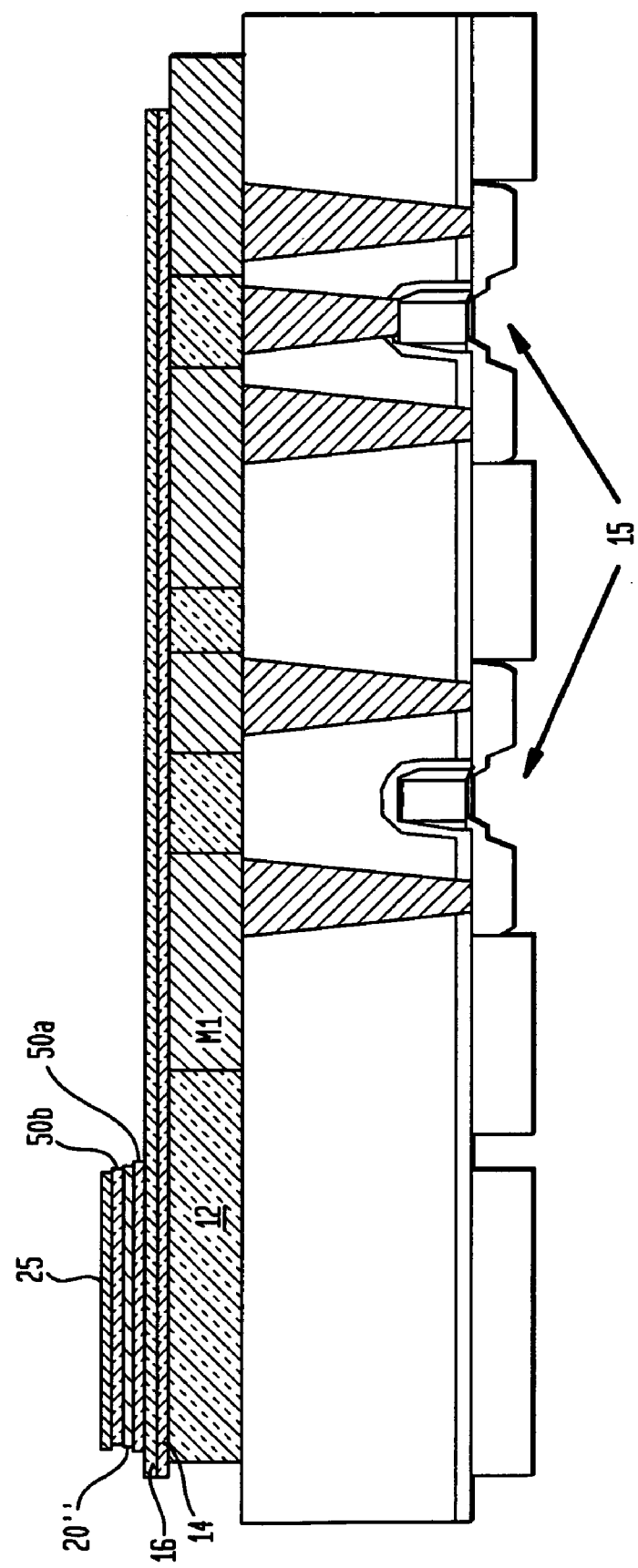

In a second embodiment of the invention, as shown in FIG. 3(a), the thin film resistor structure is sandwiched between two thin CDEL layers 50a, 50b. This entails process steps of sequentially depositing dielectric layers 14, 16, first CDEL layer 50a, the thin-film conductor layer 20 of material forming the thin-film resistor, a second CDEL layer 50b deposited atop the thin-film conductor layer 20 and, the final etch stop layer 25 deposited above the second CDEL layer 50b. As in the first embodiment, the two thin CDEL layers 50a, 50b comprise an insulator material such as $Al_2O_3$ layer deposited to a thickness of less than 100 Å by atomic layer deposition (ALD) and preferably, to a thickness of about 50 Å or less. Alternatively, the CDEL layers 50a,b may comprise a thin layer of Aluminum, deposited to a thickness ranging between 10 Å and 20 Å and oxidized by an $O_2$ plasma or air oxidation. In other example embodiments, the CDEL layers 50a,b may comprise metal oxides such as $Ta_2O_5$, $HfO_2$, $ZrO_2$ and the like. Sandwiched between the first and second CDEL layers 50a,b is the thin film resistor, typically TaN or other conductive materials, as described herein with respect to the first embodiment. As described above, the conductive metal 20 is a thin layer whose thickness is typically from about 300 Å to about 700 Å with a thickness of about 500 Å nominally. The CDEL layers 50a,b preferably is formed of a material that adheres well to the underlying thin film resistor material TaN and increases the current carrying capability of the resistor device as will be further described. The conductive metal 20 forming the thin-film resistor can be formed on the first CDEL layer 50a utilizing any deposition process including, for example, CVD, PECVD, sputtering, plating, evaporation, ALD and other like deposition processes. After forming the conductive metal 20, the second thin Current Density Enhancing Layer (CDEL) 50b is deposited on the conductive metal layer 20, and the etch stop layer 25 is deposited on CDEL layer 50b providing the structure shown in FIG. 3(a). Then, in a next processing step, the thin-film resistor features are patterned using an applied lithographic mask (i.e., a resist layer not shown), and an etching step is performed to form the resistor device 20" such as shown in FIG. 3(b). This is accomplished by removing the layers 25, 50b, 20 and 50a outside of the defined mask perimeter and stopping on layer 16 as shown in FIG. 3(b). Next, the formed photomask (resist) layer 120 is removed. Continuing as shown in FIG. 3(c), a further interlevel dielectric layer 125, formed of materials described herein, is deposited on top of the exposed layer 16 and over the resistor structure 20" and is planarized to form the structure shown in FIG. 3(c). Finally, as shown in FIG. 3(d), via structures V1 may be formed using conventional techniques to electrically couple the resistor device 20" of the invention to a further metallization layer, e.g., M2.

Figure 2F:
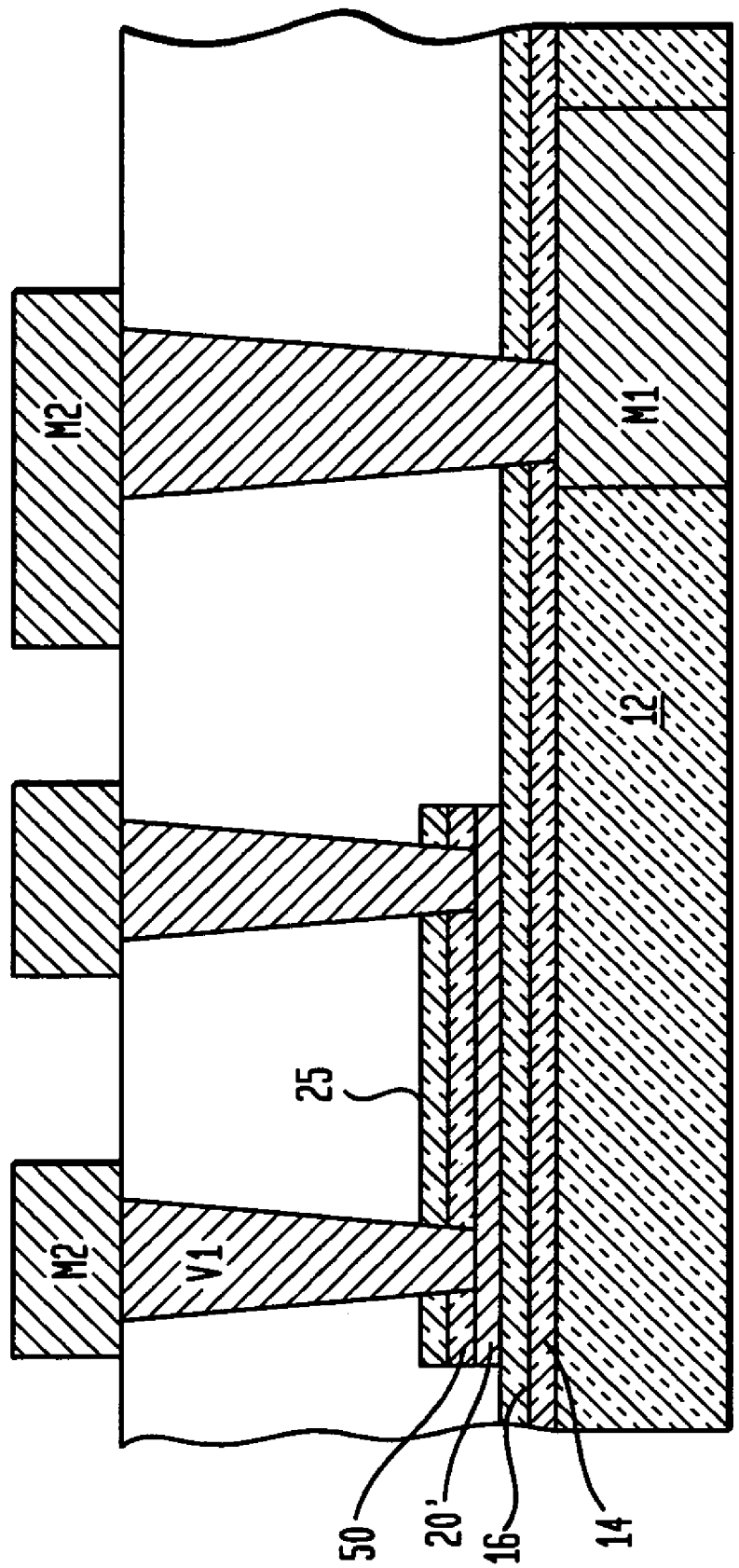
Figure 3D:
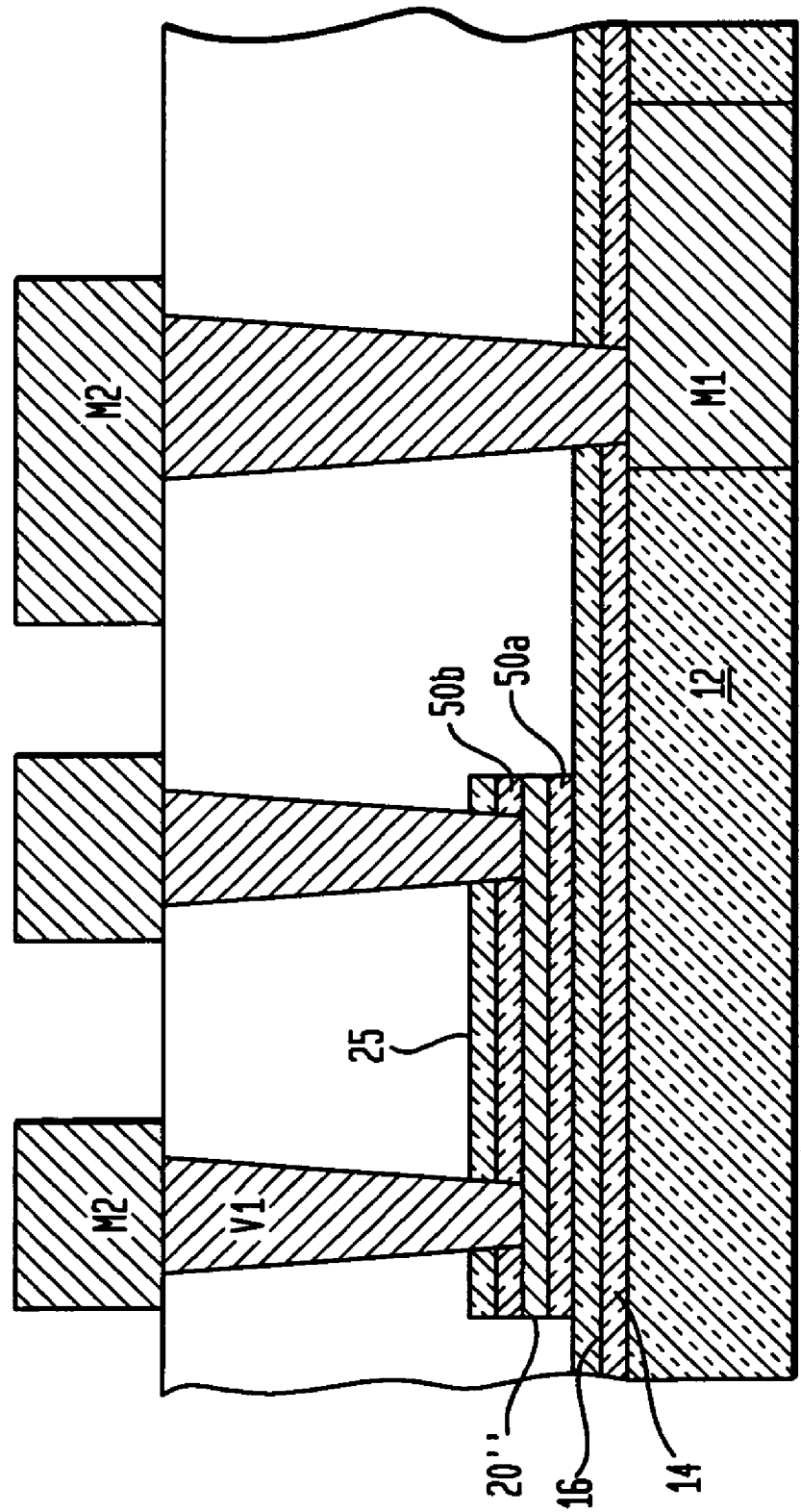

By providing the CDEL layer(s) according to the first and second embodiments, there is increased ability to pump in more current through the resistor structure 20' (FIG. 2(f)) and 20" (FIG. 3(d)) without degradation of the resistance, i.e., without shifting the resistance. This is illustrated in Table 1 as now described:

TABLE 1

| CDEL Information | Vstress (V) | $I_0$ (mA) | $I_{24}$ (mA) | $R_0$ (ohms) | $R_{24}$ (ohms) | % $R_{24}$ shift |
|---|---|---|---|---|---|---|
| 50A $Al_2O_3$ | 1.38 | 20.62 | 19.56 | 66.93 | 70.55 | 5.41 |
| 100A $Al_2O_3$ | 1.39 | 20.83 | 19.72 | 66.73 | 70.49 | 5.63 |
| No $Al_2O_3$ | 1.19 | 20.36 | 18.84 | 58.45 | 63.16 | 8.10 |

Table 1 describes the resistance to shift for an example application of stress applied to an example resistor structure formed according to the present invention. The example resistor device structure is of a resistor size approximately 10 μm×10 μm with an applied current density of 2 mA/μm of width. The stress is a high temperature stress of approximately 125° C. applied for a period of 24 hours. Thus, as shown in Table 1, $I_0$ is Current at Time 0 Hours—before current stress; $R_0$ is resistance at Time 0 Hours—before current stress; $I_{24}$ is the current after Time 24 Hours, i.e., the end of current stress; $R_{24}$ is the device's resistance after time 24 Hours (end of current stress); and, % $R_{24}$ is shift in resistance after 24 hours of constant current stress at the above conditions. In an example resistor formed according to a first embodiment of the invention where the resistor comprises a single CDEL layer of $Al_2O_3$ layer of approximately 50 Å, with a voltage impressed upon the resistor for a period of 24 hours at high temperature, Table 1 reveals that a 5.4% shift in resistance is exhibited as the initial resistance value, $R_0$, at time zero is 66.93 ohms. This corresponds to an initial current $I_0$, of about 20.6 mA with 1.38 V impressed. At 24 hours later, the current has decreased to about 19.56 mA corresponding to an increased resistance $R_{24}$ to about 70.55 ohms which corresponds to a per cent resistance shift of about 5.4%. It is seen that for the case of a single sided CDEL of $Al_2O_3$ layer of approximately 100 Å, with a voltage impressed upon the resistor for a period of 24 hours at high temperature, Table 1 reveals that a 5.6% shift in resistance is exhibited. This corresponds to an initial resistance value, $R_0$, of 66.73 ohms at time zero and a final resistance value $R_{24}$ to 24 hours later of about 70.49 ohms with a constant voltage impressed upon the resistor device. As shown, this is a marked decrease in percent resistance shift exhibited in the case of a resistor device with no $Al_2O_3$ CDEL layer which is about 8.0. As the example one-sided 100 Å CDEL layer resistor structure does not exhibit a marked increased resistance to shift as compared to an example one-sided 50 Å CDEL layer resistor structure, it is preferred that the resistor structure be formed with a CDEL layer of 50 Å or less.

It should be understood that, the resistor device of the present invention may be formed in front end of line processes, for example, formed on a substrate and coupled to other device regions including bipolar transistors and/or CMOS devices, such as FETs.

While the present invention has been described and shown with respect to preferred embodiments thereof, it will be understood by those skilled in the art that the foregoing and other changes in forms and details may be made without departing from the spirit and scope of the present application. It is therefore intended that the present application not be limited to the exact forms described and illustrated, but fall within the scope of the appended claims.

What is claimed is:

1. A thin-film resistor for a semiconductor circuit structure comprising:
   a thin film layer of electrical conductive material having a resistance value;
   a current density enhancing layer (CDEL) comprising an electrical insulative material located on one side of said thin film layer of electrical conductive material, wherein said current density enhancing layer enables the said thin film resistor to carry higher current densities with reduced shift in resistance.

2. The thin-film resistor as claimed in claim 1, wherein said thin film layer of electrical conductive material comprises one of: Ta, TaN, TiN, W, WN, NiCr and SiCr.

3. The thin-film resistor as claimed in claim 2, wherein said CDEL is of a material adapted to provide good adhesion to said thin film layer of electrical conductive material.

4. The thin-film resistor as claimed in claim 2, further including an insulative layer formed on top of said thin film resistor.

5. The thin-film resistor as claimed in claim 1, wherein said current density enhancing layer comprises a metal oxide film.

6. The thin-film resistor as claimed in claim 5, wherein said metal oxide film comprises one of $Al_2O_3$, $Ta_2O_5$, $HfO_2$, and $ZrO_2$.

7. The thin-film resistor as claimed in claim 5, wherein said current density enhancing layer is deposited by Atomic Layer Deposition process.

8. The thin-film resistor as claimed in claim 1, wherein said current density enhancing layer is of a thickness of 50 Å or less.

9. The thin-film resistor as claimed in claim 1, formed on an insulative semiconductor structure in a Back-End-Of-Line (BEOL) process.

10. The thin-film resistor as claimed in claim 9, where said thin film resistor is electrically coupled to a metal level of a semiconductor circuit by an electrical conductive material filled via structure.

11. The thin-film resistor as claimed in claim 1, formed on an insulative semiconductor structure in a Front-End-Of-Line (FEOL) process.

12. The thin-film resistor as claimed in claim 1, wherein said CDEL is formed on top of said thin film layer of electrical conductive material.

13. The thin-film resistor as claimed in claim 12, further comprising an additional CDEL located below said thin film layer of electrical conductive material.

14. A method of manufacturing a thin-film resistor for a semiconductor circuit structure comprising the steps of:
    forming a thin film layer of electrical conductive material adapted to form a thin film resistor device;
    forming a current density enhancing layer (CDEL) comprising an electrical insulative material on top of said thin film layer of electrical conductive material; and
    patterning said thin film layer of electrical conductive material and said CDEL to form said thin film resistor device, wherein said current density enhancing layer enables the said thin film resistor device to carry higher current densities with reduced shift in resistance.

15. The method as claimed in claim 14, wherein said step of forming said thin film layer of electrical conductive material comprises depositing a layer of electrical conductive material via a deposition process.

16. The method as claimed in claim 15, wherein said deposition process includes one of: a CVD, PECVD, sputtering, plating, evaporation, and Atomic Layer Deposition.

17. The method as claimed in claim 14, wherein said thin film layer of electrical conductive material comprises one of: Ta, TaN, TiN, W, WN, NiCr and SiCr.

18. The method as claimed in claim 14, wherein said current density enhancing layer comprises a material adapted to provide good adhesion to said thin film layer of electrical conductive material.

19. The method as claimed in claim 18, wherein said CDEL comprises a metal oxide film deposited to a thickness of 50 Å or less.

20. The method as claimed in claim 19, wherein said metal oxide film comprises one of $Al_2O_3$, $Ta_2O_5$, $HfO_2$, and $ZrO_2$.

21. The method as claimed in claim 18, further comprising the step of forming a layer of insulator material layer on top of said CDEL.

22. A method of manufacturing a thin-film resistor for a semiconductor circuit structure comprising the steps of:
    forming a first current density enhancing layer (CDEL) comprising a first electrical insulative material on top of a semiconductor circuit structure;
    forming a thin film layer of electrical conductive material adapted to form a thin film resistor device on top of said first CDEL; and,
    forming a second CDEL comprising a second electrical insulative material on top of said thin film layer of electrical conductive material,
    patterning thin film layer of electrical conductive material and said first and said second CDEL layers to form said thin film resistor device, wherein said first and said second current density enhancing layers enable the said thin film resistor device to carry higher current densities with reduced shift in resistance.

23. The method as claimed in claim 22, wherein said step of forming said thin film layer of electrical conductive material comprises a depositing a layer of an electrical conductive material via a deposition process.

24. The method as claimed in claim 23, wherein said deposition process includes one of: a CVD, PECVD, sputtering, plating, evaporation, and Atomic Layer Deposition.

25. The method as claimed in claim 22, wherein said thin film layer of electrical conductive material comprises one of: Ta, TaN, TiN, W, WN, NiCr and SiCr.

26. The method as claimed in claim 22, wherein said first and second current density enhancing layers comprise a material adapted to provide good adhesion to said thin film layer of electrical conductive material.

27. The method as claimed in claim 26, wherein the material comprises a metal oxide film deposited to a thickness of 50 Å or less.

28. The method as claimed in claim 22, further comprising the step of forming an insulative layer on top of said second CDEL.

* * * * *